United States Patent
Hosokawa

(10) Patent No.: US 6,634,686 B2
(45) Date of Patent: Oct. 21, 2003

(54) END EFFECTOR ASSEMBLY

(75) Inventor: Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/970,546

(22) Filed: Oct. 3, 2001

(65) Prior Publication Data
US 2003/0067180 A1 Apr. 10, 2003

(51) Int. Cl.⁷ .............................................. B65G 49/07
(52) U.S. Cl. .................... 294/1.1; 294/902; 414/941
(58) Field of Search .......... 294/1.1, 902; 414/935–941; 901/30

(56) References Cited

U.S. PATENT DOCUMENTS

| | | | |
|---|---|---|---|
| 4,736,508 A | * 4/1988 | Poli et al. ...................... 29/445 |
| 4,848,814 A | * 7/1989 | Suzuki et al. ................. 294/1.1 |
| 5,061,144 A | * 10/1991 | Akimoto et al. .......... 414/222.02 |
| 5,445,486 A | * 8/1995 | Kitayama et al. ......... 414/416.03 |
| 5,788,304 A | * 8/1998 | Korn et al. .................. 294/159 |
| 5,931,631 A | * 8/1999 | Bonora et al. .......... 414/416.01 |
| 5,984,391 A | 11/1999 | Vanderpot et al. ........... 294/1.1 |
| 6,077,026 A | 6/2000 | Shultz ..................... 414/744.1 |
| 6,158,951 A | * 12/2000 | Carr et al. ................ 414/749.4 |
| 6,213,704 B1 | 4/2001 | White et al. ................. 414/217 |
| 6,256,555 B1 | 7/2001 | Bacchi et al. ................ 700/245 |
| 6,257,827 B1 | 7/2001 | Hendrickson et al. ...... 414/805 |
| 6,322,116 B1 | * 11/2001 | Stevens ...................... 294/64.3 |
| 6,371,716 B1 | * 4/2002 | Byun et al. ............. 414/416.03 |
| 2002/0041102 A1 | 4/2002 | Krauskopf et al. .......... 294/1.1 |

FOREIGN PATENT DOCUMENTS

| | | | |
|---|---|---|---|
| EP | 1 041 604 | 10/2000 | ............ H01L/21/00 |
| EP | 1 063 683 | 12/2000 | ............ H01L/21/00 |
| JP | 2001-135603 | 5/2001 | ......... H01L/21/304 |

* cited by examiner

Primary Examiner—Dean J. Kramer
(74) Attorney, Agent, or Firm—Moser, Patterson & Sheridan LLP

(57) ABSTRACT

Generally, an end effector assembly for a substrate transfer robot is provided. In one embodiment, an end effector assembly for a substrate transfer robot includes an end effector having a plurality of metallic pads disposed thereon. A polymer pad is disposed on each metallic pad wherein a ratio of an exposed portion of an upper surface of the metallic pad to a top surface of the polymer pad is at least about 3.5 to 1. In another embodiment, an end effector assembly for a substrate transfer robot includes an end effector having a plurality of polymer pads disposed thereon. Each polymer pad includes a fluoropolymer coating disposed on at least a top surface of the polymer pad. The metallic pad and/or the coating allows the polymer pad to be at least temporarily utilized in applications above its normal operating temperature.

50 Claims, 9 Drawing Sheets

END EFFECTOR ASSEMBLY

BACKGROUND OF THE INVENTION

1. Field of the Invention

Embodiments of the invention relate to an end effector assembly for supporting substrates.

2. Background of the Related Art

Thin film transistors (TFTS) are conventionally made on large glass substrates or plates for use in monitors, flat panel displays, solar cells, personal digital assistants (PDAs), cell phones and the like. TFTs are made in a cluster tool by sequential deposition of various films including amorphous silicon, doped and undoped silicon oxides, silicon nitride and the like in vacuum chambers typically disposed around a central transfer chamber. Production of good quality polysilicon precursor films utilized in these structures requires that the hydrogen content of the film be controlled below about 1 percent. In order to achieve this low hydrogen content, post deposition heat treatment of the film at temperatures of about 550 degrees Celsius is required.

Accordingly, robots utilized to move substrates in these cluster tools must have end effectors designed to withstand these high temperatures. Generally, conventional transfer robots are not suited for operation at such high temperatures. Particularly, the end effectors of vacuum robots utilized in flat panel processing systems typically include one or more rubber friction pads upon which the substrates rest. The friction pads generally prevent the substrate from sliding relative to the end effector as the robot transfers the substrate from chamber to chamber. Several high temperature rubber compounds are available but are typically limited to a maximum operating temperature of about 320 degrees Celsius, significantly lower than the 550 degrees Celsius desired in polysilicon heat treating processes. When the end effector of the robot is exposed to high temperature for more than ten seconds, these conventional rubber pads typically melt and stick to the substrate. The melted rubber stuck to the backside of the substrate is undesirable both due to potential contamination and subsequent processing issues. Moreover, once the rubber pad is removed from the end effector, scratching of the backside of the substrate by the end effector may occur which may lead to particulate generation and substrate damage or breakage. Furthermore, if the rubber pad melts, replacement of the pad is difficult.

Therefore, there is a need for an end effector suitable for use at elevated temperatures.

SUMMARY OF THE INVENTION

In one aspect of the invention, an end effector assembly for a substrate transfer robot is provided. In one embodiment, an end effector assembly for a substrate transfer robot includes an end effector having a plurality of metallic pads disposed thereon. A polymer pad is disposed on each metallic pad wherein a ratio of an exposed portion of an upper surface of the metallic pad to a top surface of the polymer pad is at least about 3.5 to 1.

In another embodiment, an end effector assembly for a substrate transfer robot includes an end effector having a plurality of polymer pads disposed thereon is provided. Each polymer pad includes a fluoropolymer coating disposed on at least a top surface of the polymer pad.

In another embodiment, an end effector having a plurality of metallic pads disposed thereon is provided. A polymer pad is disposed on each metallic pad wherein a ratio of an exposed portion of an upper surface of the metallic pad to a top surface of the polymer pad is at least about 3.5 to 1. Each polymer pad includes a fluoropolymer coating disposed on at least a top surface of the polymer pad. The metallic pad and/or the coating allows the polymer pad to be at least temporarily utilized in applications above its normal operating temperature.

In yet another embodiment end effector assembly for a substrate transfer robot includes an end effector having a plurality of polymer pads disposed thereon is provided. The polymer pads have a patterned surface to minimize thermal transfer with the substrate.

BRIEF DESCRIPTION OF THE DRAWINGS

A more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
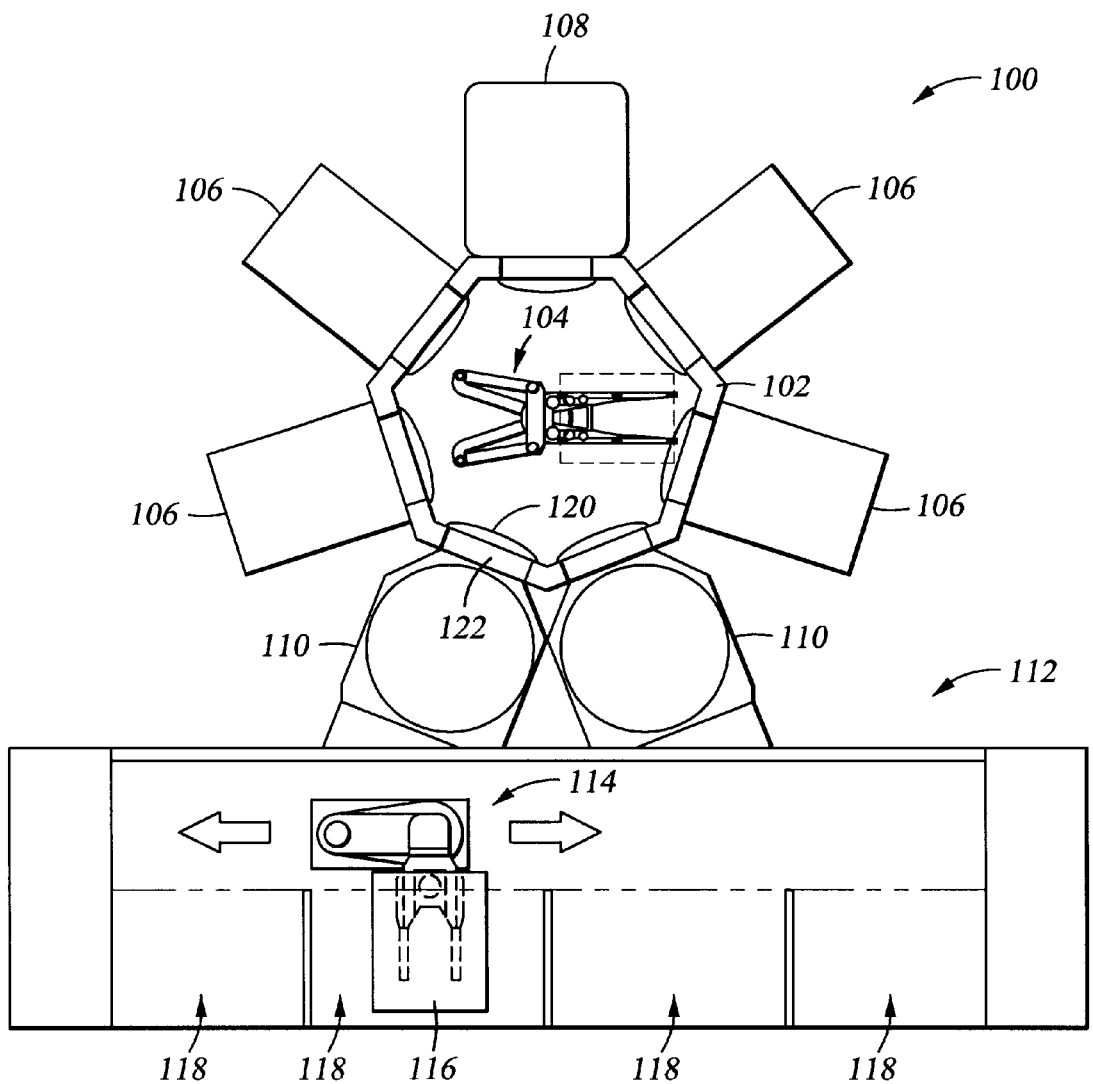
FIG. 1 is a plan view of one embodiment of a processing system.

FIG. 1 depicts a schematic layout of a cluster tool 100. The cluster tool 100 generally comprises a transfer chamber 102 having a first transfer robot 104 disposed therein. The transfer chamber 102 is surrounded by a plurality of processing chambers 106, a thermal processing chamber 108 and at least one load lock chamber 110. The load lock chambers 110, two of which are depicted in FIG. 1, are generally coupled between the transfer chamber 102 and a factory interface 112.

The factory interface 112 generally includes a second transfer robot 114 that transfers substrates 116 between the load locks 110 and a plurality of wafer storage cassettes 118 coupled to or disposed within the factory interface 112. The second transfer robot 114 may be configured similar to the first transfer robot 104 described below. The factory interface 112 is generally maintained at or near atmospheric pressure. The second transfer robot 114 is typically configured to move laterally within the factory interface 112 so substrates 116 may be transferred between the load locks 110 and the cassettes 118 with minimal handling and time expenditure.

Each load lock chamber 110 generally allows for the substrate 116 to be transferred between a sub-atmospheric environment maintained in the transfer chamber 102 and the atmospheric environment of the factory interface 112 without loss of vacuum from the transfer chamber 102. The load lock chambers 110 may be configured to transfer more than one substrate 116 at a time and may additionally heat or cool the substrates. One load lock chamber that may be used to advantage is described in U.S. Pat. No. 09/464,362, filed Dec. 15, 1999 (attorney docket no. 3790), which is hereby incorporated by reference in its entirety.

The transfer chamber 102 is typically fabricated from a single mass of material such as aluminum to minimize vacuum leaks. The transfer chamber 102 includes a plurality of passages 122 disposed in the walls of the chamber 102 to allow transfer of a substrate therethrough. Each passage 122 is selectively sealed by an isolation valve 120. One isolation valve that may be used to advantage is described in U.S. Pat. No. 6,079,693, issued Jun. 27, 2000 to Ettinger et al., which is hereby incorporated by reference in its entirety.

The processing chambers 106 are generally disposed about the perimeter of the transfer chamber 102. The processing chambers 106 may be configured to include etch chambers, deposition chambers and/or other chambers suitable for fabricating a desired structure or device on a substrate.

The thermal processing chamber 108 generally heats or thermally treats one or more substrates 116 disposed therein. The thermal processing chamber 108 generally includes at least one substrate support (not shown) adapted to support one or more substrates 116 within the thermal processing chamber 108. The thermal processing chamber 108 additionally includes a thermal control system (also not shown), which may includes lamps, resistive heaters, fluid conduits and the like, to uniformly heat substrates to about 550 degrees Celsius. One thermal processing chamber that may be used to advantage is described in U.S. Patent Provisional Application Serial No. 60/259,035, filed Dec. 29, 2000 (attorney docket no. 5163L), by Q. Shang, which is hereby incorporated by reference in its entirety.

The first transfer robot 104 is centrally disposed in the transfer chamber 102. Generally, the first transfer robot 104 is configured to transfer substrates 116 between the chambers 106, 108, 110 surrounding the transfer chamber 102. The first transfer robot 104 is typically configured to handle single substrates, however, robots configured to handle multiple substrates may also be utilized.

Figure 2:
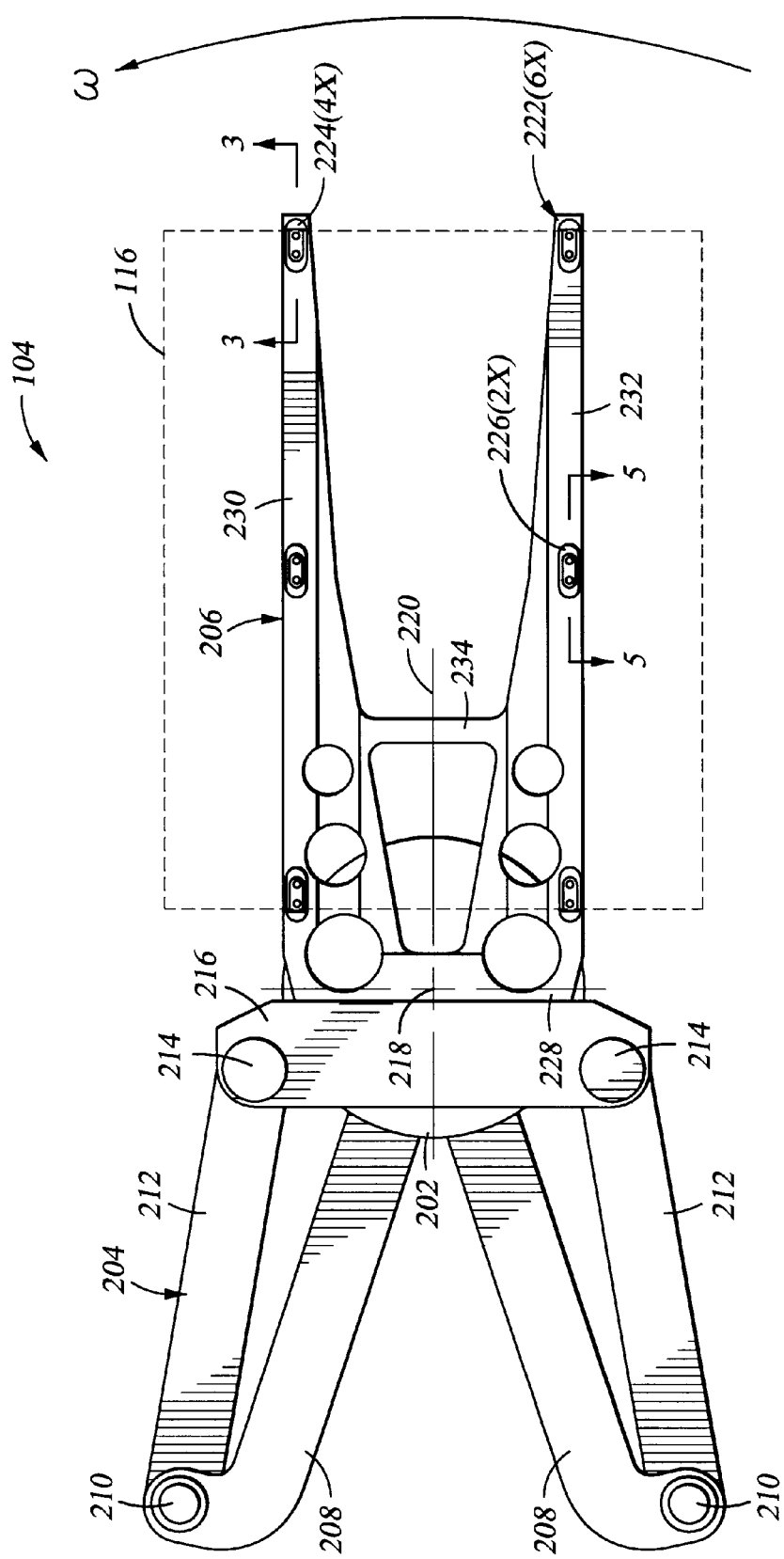
FIG. 2 is a plan view of one embodiment of a transfer robot.

FIG. 2 is a plan view of one embodiment of a first transfer robot 104. The first transfer robot 104 generally comprises a robot body 202 that is coupled by a linkage 204 to an end effector 206 that supports a substrate 116 (shown in phantom) thereon. The end effector 206 may be configured to retain the substrate thereon in a desired manner, such as, for example, friction, electrostatically, vacuum chucking, clamping, edge gripping and the like. In one embodiment, the linkage 204 has a frog-leg configuration. Other configurations for the linkage 204, for example, a polar configuration may be alternatively utilized. One example of a polar robot that may benefit from the invention is described in U.S. Pat. No. 09/547,189, filed Apr. 11, 2000 by Ettinger et al., now U.S. Pat. No. 6,361,422 which is incorporated herein in its entirety.

The linkage 204 generally includes two wings 208 coupled by an elbow 210 to two arms 212. Each wing 208 is additionally coupled to an electric motor (not shown) concentrically stacked within the robot body 202. Each arm 212 is coupled by a bushing 214 to a wrist 216. The wrist 216 couples the linkage 204 to the end effector 206. Typically, the linkage 204 is fabricated from aluminum, however, materials having sufficient strength and smaller coefficients of thermal expansion, for example, titanium, stainless steel, metal matrix or a ceramic such as titanium-doped alumina, may also be utilized.

Each wing 208 is independently controlled by one of the concentrically stacked motors. When the motors rotate in the same direction, the end effector 206 is rotated at an angle ω about the center 218 of the robot body 202 at a constant radius. When both of the motors are rotated in opposite directions, the linkage 204 accordingly expands or contracts, thus moving the end effector 206 radially inward or outward along an imaginary line 220 passing through the center 218 of the first transfer robot 104. The first transfer robot 104 is also capable of a hybrid motion resulting from combining the radial and rotational motions simultaneously.

The end effector 206 is typically fabricated from aluminum, quartz, carbon, metal matrix or ceramic and configured to support a substrate with minimal sag. In the embodiment depicted in FIG. 2, the end effector 206 is ceramic and includes a base 228 having a first member 230 and a second member 232 extending therefrom. The base 228 is coupled to the wrist 216 of the first transfer robot 104. The first member 230 and the second member 232 are generally disposed in spaced-apart relation typically mirrored about the imaginary line 220. The length and spacing between the first member 230 and the second member 232 is selected to adequately support the substrate during transfer while minimizing substrate sag. At least one connecting member 234 is coupled between the first member 230 and second member 232 to provide additional structural rigidity to the end effector 206.

The end effector 206 generally includes a plurality of substrate supports 222 disposed thereon to support a substrate. In the embodiment depicted in FIG. 2, the end effector 206 has three substrate supports 222 disposed respectively on the first and second members 230, 232 for a total of six (6) substrate supports 222. The substrate supports 222 comprise a plurality of edge supports 224 typically used in combination with at least one center support 226. Two edge supports 224 and one center support 226 are shown on each member 230, 232.

Figure 3:
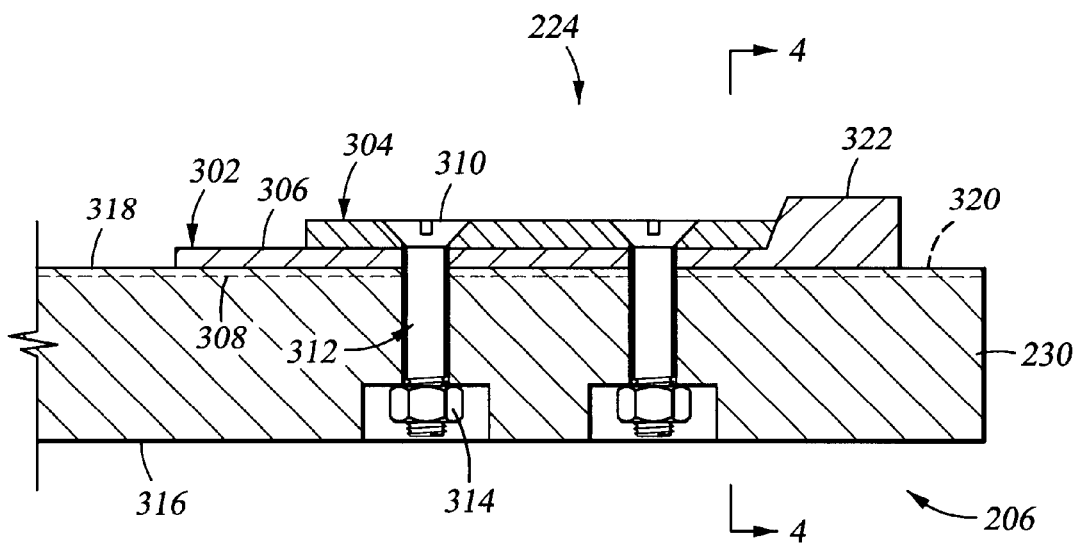
FIG. 3 is a sectional view of one embodiment of a support taken along section line 3—3 of FIG. 2.

FIG. 3 depicts a sectional view of one embodiment of the edge support 224 taken along section line 3—3 of FIG. 2. The edge support 224 generally includes a metallic pad 302 and a polymer pad 304. The metallic pad 302 has an upper substrate contacting surface 306 and a lower mounting surface 308. The lower surface 308 mounts on the end effector 206. The lower surface 308 may be coupled to the end effector 206 by adhesives, staking, screws, rivets, or other fastening devices. In the embodiment depicted in FIG. 3, the metallic pad 302 is coupled to the end effector 206 by a plurality of fasteners 310 (e.g., two are shown) disposed through a respective hole 312 passing through the end effector 206, polymer pad 304 and the metallic pad 302 into a nut or threaded insert 314 disposed in a lower surface 316 of the end effector 206.

The upper surface 306 of the metallic pad 302 is partially covered by the polymer pad 304. Generally, the ratio of an exposed portion of the upper surface 306 to an exposed portion of the polymer pad 304 is at least about 3.5 to 1. As heat transfer from the metallic pad 302 is more rapid than the polymer pad 304, heat is readily transferred from the metallic pad 302, thereby acting as a heat sink for the polymer pad 304. The greater exposed surface area of the metallic pad 302 allows heat to be quickly dissipated from the metallic pad 302 thereby cooling the polymer pad 304 coupled thereto.

One end of the metallic pad 302 may include a lip 322 projecting upwards from the upper surface 306. The lip 322 generally extends beyond the polymer pad 304 such that the substrate 116, when seated on the polymer pad 304, is restrained from sliding in at least one direction by the lip 322.

The metallic pad 302 is typically fabricated from a thermally conductive metal. In one embodiment, the metallic pad 302 is comprised of aluminum. The metallic pad 302 may additionally be finished to enhance the rate of heat transfer therefrom. Some finishes may include polishing, coating, plating and other heat transfer enhancing operations or materials. The metallic pad 302 may be mirror polished to a surface finish of at least 4 rms or smoother. Alternatively and/or additionally, the metallic pad 302 may be electropolished. The smooth and polished surface increases the contact area between the metallic pad 302 and the polymer pad 304 and the contact area between the metallic pad 302 and the end effector 206, thus enhancing the contact area available for heat transfer. Additionally, the smooth and/or polished surface finish of the exposed portion of the metallic pad 302 reflects heat such that the metallic pad 302 does not readily absorb heat while the end effector 206 is disposed proximate a high temperature area.

The polymer pad 304 is generally comprised of a high temperature polymer. In one embodiment, the polymer pad 304 is comprised of a fluorocarbon elastomer. Examples of compounds suitable for fabricating the polymer pad 304 include, but are not limited to, high temperature plastics, polybenzimidazole, fluoropolymers, VITON®, KALREZ®, CERAZOLE®PBI, CHEMREZ® and Parker FF350-75 among others.

In one embodiment, the polymer pad 304 is white. The white color of the polymer pad 304 decreases the emissivity of the polymer pad as compared to conventional high-temperature polymers that generally are black and have an emissivity of 0.8 and greater. In one embodiment, the emissivity of a white polymer pad is less than about 0.7, which yields about a 14 percent improvement in heat absorption over black material, substantially contributing to maintaining the polymer pad 302 at a cool temperature (i.e., less than about 350 degrees Celsius) and preventing the pad from bonding to a substrate.

The polymer pad 304 may be a layer, film or coating and may be bonded, press or snap fit, vulcanized or fastened to the metallic pad 302. The polymer pad 304 may also be molded to the metallic pad 302 or may include an insert molded therein that is adapted to mate with a fastener passing through the metallic pad 302. Other methods of retaining the elastomer pad to the metallic pad 302 are also contemplated.

Figure 4:
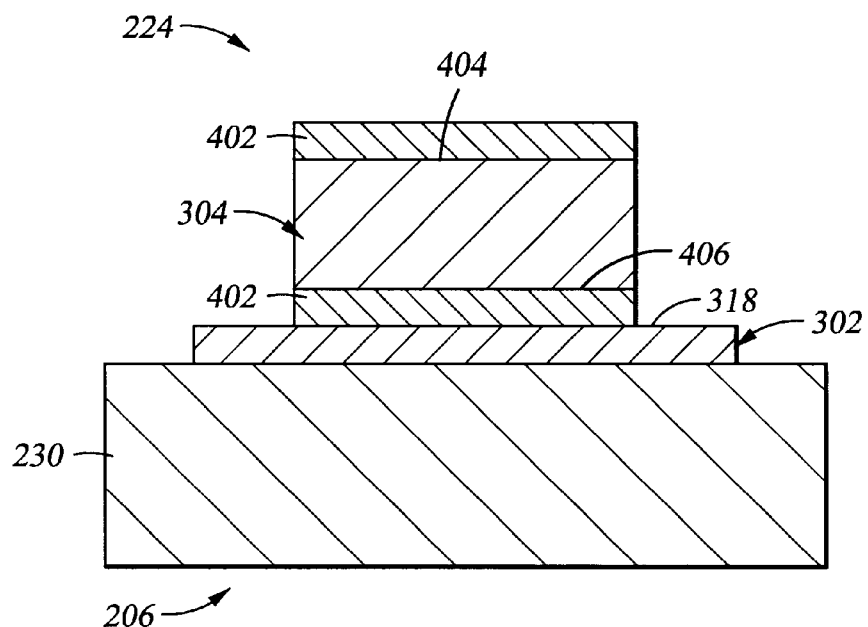
FIG. 4 is a sectional view of the support taken along section line 4—4 of FIG. 3.

Referring to the sectional view of the polymer pad 304 in FIG. 4, the polymer pad 304 may optionally comprise a coating 402 on one or more sides of the pad 304. In one embodiment, the coating 402 is comprised of a fluoropolymer disposed at least on a top surface 404 of the polymer pad 304. In the embodiment depicted in FIG. 3, the coating 402 is additionally disposed on a lower surface 406 of the polymer pad 304. The coating 402 generally protects the underlying polymer (e.g., the polymer pad 304) from direct exposure to hot surfaces and radiant heat sources. Depending on temperatures to which the end effector 206 is exposed, and material selections for the polymer pad 304 and the coating 402, the metallic pad 302 may be eliminated in some configurations.

Returning to FIG. 3, the end effector 206 may additionally comprise a thin metallic layer 320. In one embodiment, the metallic layer 320 comprises a layer of reflective metal such as aluminum disposed on at least a top surface 318 of the end effector 206. The metallic layer 320 may be polished or electropolished to increase the radiant reflectivity of the metallic layer 320. The thermal conductivity of the metallic layer 320 additionally assists in drawing heat from the metallic pad 302, thereby maintaining the polymer pad 304 below a temperature that caused the pad 304 to begin sticking to the substrate 116.

Figure 5:
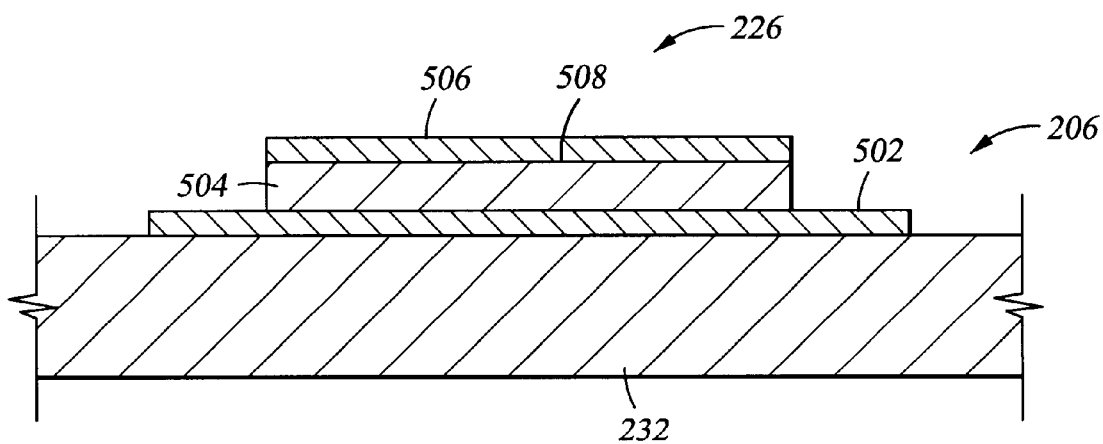
FIG. 5 depicts a sectional view of one embodiment of a center support taken along section line 5—5 of FIG. 2.

FIG. 5 depicts one embodiment of the center support 226. The center support 226 generally includes a metallic pad 502 having a polymer pad 504 disposed thereon. The center support 226 is generally identical to the edge support 224 described with reference to FIGS. 3 and 4, except wherein the metallic pad 502 does not include a lip. The center support 226 is typically utilized to support a center region of a substrate, although the center support 226 may also be utilized to support one or more edges of the substrate 116.

The center support 226 may optionally include a coating 506 disposed on at least an upper surface 508 of the polymer pad 504. The coating 506 is generally identical to the previously described coating 402.

Figure 6:
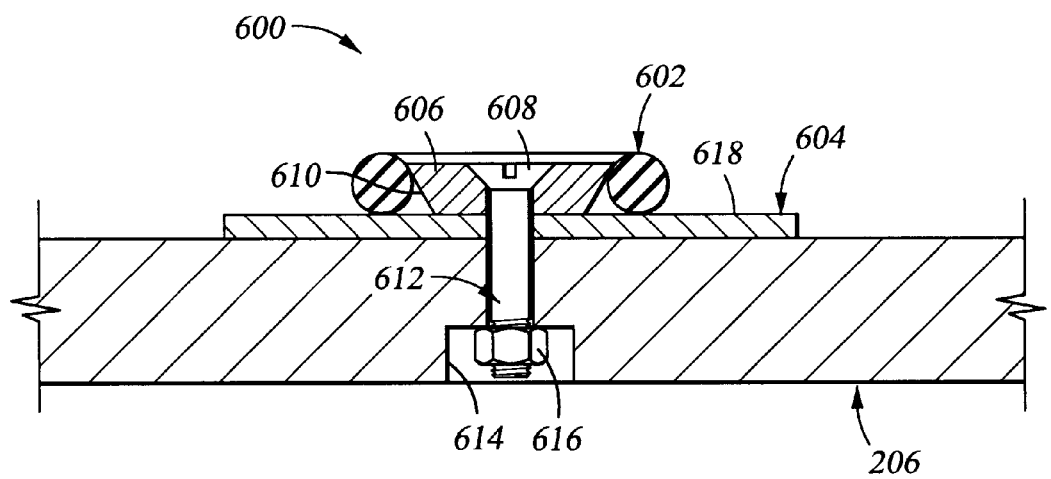
FIG. 6 depicts a sectional view of another embodiment of a center support.

FIG. 6 is a sectional view of another embodiment of a center support 600. The center support 600 generally includes a metallic pad 604 disposed on the end effector 206. A high-temperature o-ring or gasket 602 is typically disposed on an upper surface 618 of the metallic pad 604. In the embodiment depicted in FIG. 6, the gasket 602 is biased against the metallic pad 604 by a bushing 606. The bushing 606 is typically fabricated from a material having a high thermal conductivity such as aluminum. A fastener 608 is disposed through a hole 612 defined through the bushing 606, the metallic pad 604 and end effector 206. The fastener 608 may be a screw, rivet, dowel pin, spring pin or other retaining device. In the embodiment depicted in FIG. 6, the fastener 608 mates with a threaded nut 616 disposed on the lower surface of the end effector 206. The lower surface of the end effector 206 may include a counter bore 614 to allow the nut 616 and fastener 608 to remain flush or recessed from the exterior of the end effector 206.

As the fastener 608 secures the bushing 606 to the metallic pad 604, an angular sidewall 610 of the bushing 606 retains the gasket 602 to the metallic pad 604. Generally, a height of the bushing 606 relative to the metallic pad 604 is less than a diameter (or height) of the gasket 602 to prevent contact between the substrate 116 and the bushing 606 during operation of the first transfer robot 104.

Figure 7:
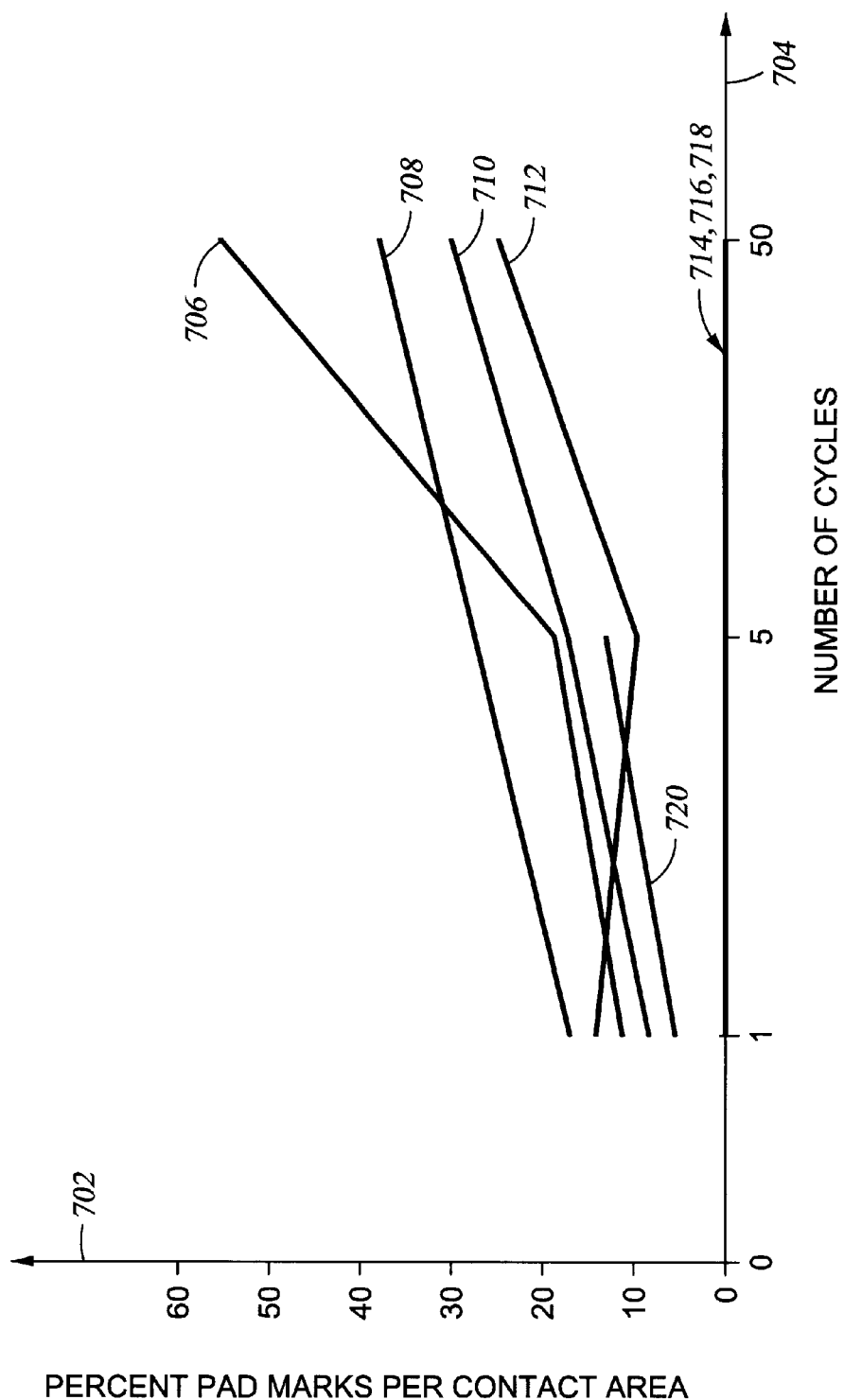
FIG. 7 is a graph depicting a percentage of pad materials stuck to a substrate versus a number of substrates transferred.

FIG. 7 depicts a graph illustrating the advantages of the invention. A vertical axis 702 represents pad marks left on the substrate as a percentage of an area of residue left on the substrate to a contact area of a polymer pad. A horizontal axis 704 represents a number of cycles (i.e., number of substrates transferred on the polymer pad). Each cycle represents a ten-fifteen second exposure at about 550 degrees Celsius. Lines 706–716 depict test results utilizing various substrate supports configured as listed in the chart below.

| Line Number | Polymer Pad Material | Coating | Metallic Pad |
| --- | --- | --- | --- |
| 706 | Kalrez ® 8475 | NO | YES |
| 708 | Parker FF350-75 | NO | NO |
| 710 | Kalrez ® 8575 | NO | YES |
| 712 | Kalrez ® 8575 | YES | NO |
| 714 | Kalrez ® 8475 | YES | NO |
| 716 | Kalrez ® 8475 | YES | YES |
| 718 | Kalrez ® 8575 | YES | YES |
| 720 | Chemrez ® SD653 | NO | NO |

As illustrated in FIG. 7, the inventive substrate supports substantially reduce or eliminate polymer pad material sticking to the substrate after repeated cycling. Reducing and eliminating contamination of the substrate by the substrate supports correspondingly increases device yield. Moreover, the heat transferring aspects of including the color of the polymer pad, the size ratio between the metallic and polymer pads and the surface finishes among other attributes effectively cool the polymer pads at a rate that allows exposure to temperatures above the rated temperature of the material comprising the polymer pad itself.

FIGS. 8A–F depict various embodiments of a polymer pad having a patterned top surface that minimizes contact area available for heat transfer between the substrate and the polymer pad. By minimizing the contact area available for heat transfer, the hot substrate will not heat the polymer pad as quickly as pads having a contact area comprising the entire top surface of the polymer pad. Although FIGS. 8A–F depict a few exemplary patterns for reducing the contact area between the polymer pad and substrate supported thereon, other patterns are contemplated and considered within the scope of the invention claimed below.

Figure 8A:
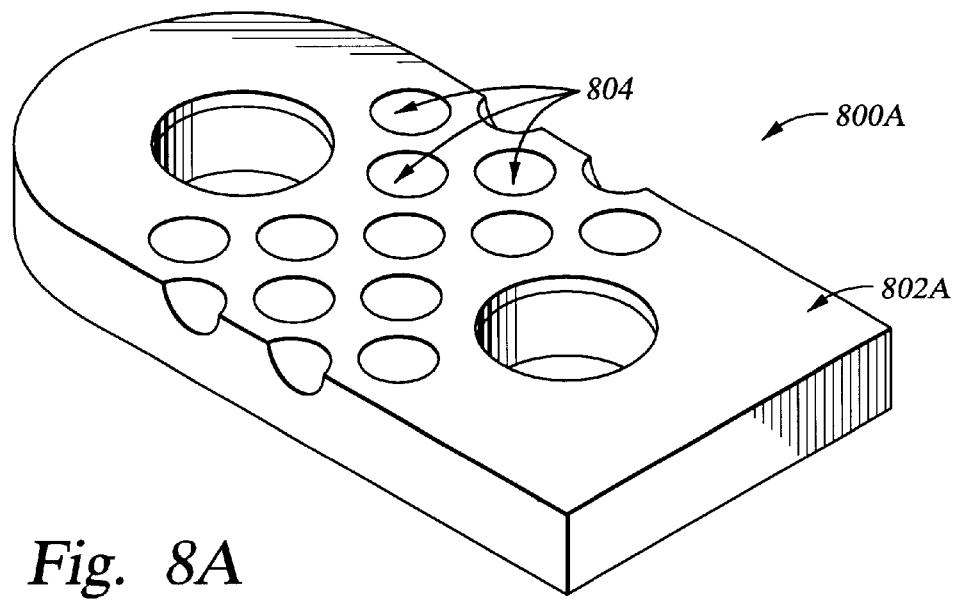
FIGS. 8A–F depict perspective views of a polymer pad.

FIG. 8A depicts a perspective view of a polymer pad 800A. The pad 800A includes a patterned top surface 802A. The top surface 802A comprises a plurality of dimples 804 formed therein. The dimples 804 may have any geometric configuration and may be disposed on the top surface 802A in a symmetrical, regular (i.e., equally spaced) or random pattern. The dimples 804 extend below a plane of the top surface 802A that supports the substrate thereby reducing the contact area of the pad 800A with the substrate.

Figure 8B:
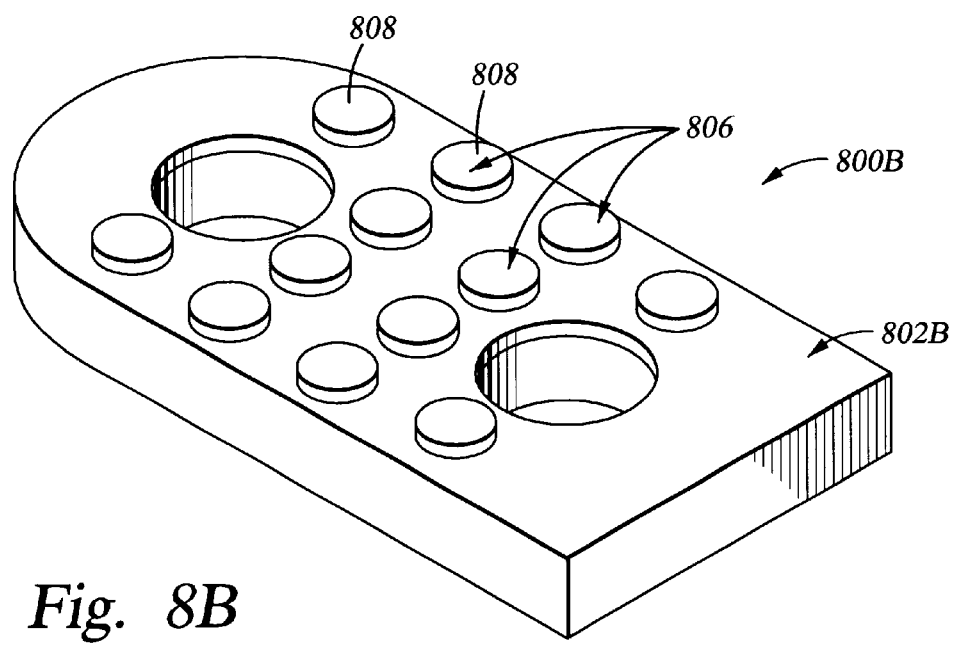

In the embodiment depicted in FIG. 8B, a polymer pad 800B includes a patterned top surface 802B that comprises a plurality of protrusions 806 extending from the top surface 802B. The protrusions 806 may have any geometric configuration and may be disposed on the top surface 802B in a symmetrical, regular (i.e., equally spaced) or random pattern. Each protrusions 806 has a top 808 that lies on a common plane that supports a substrate seated thereon. The top 808 may be flat as shown, curved or pointed. As the substrate is seated on the protrusions 806, the contact area of the pad 800B with the substrate is reduced.

Figure 8C:
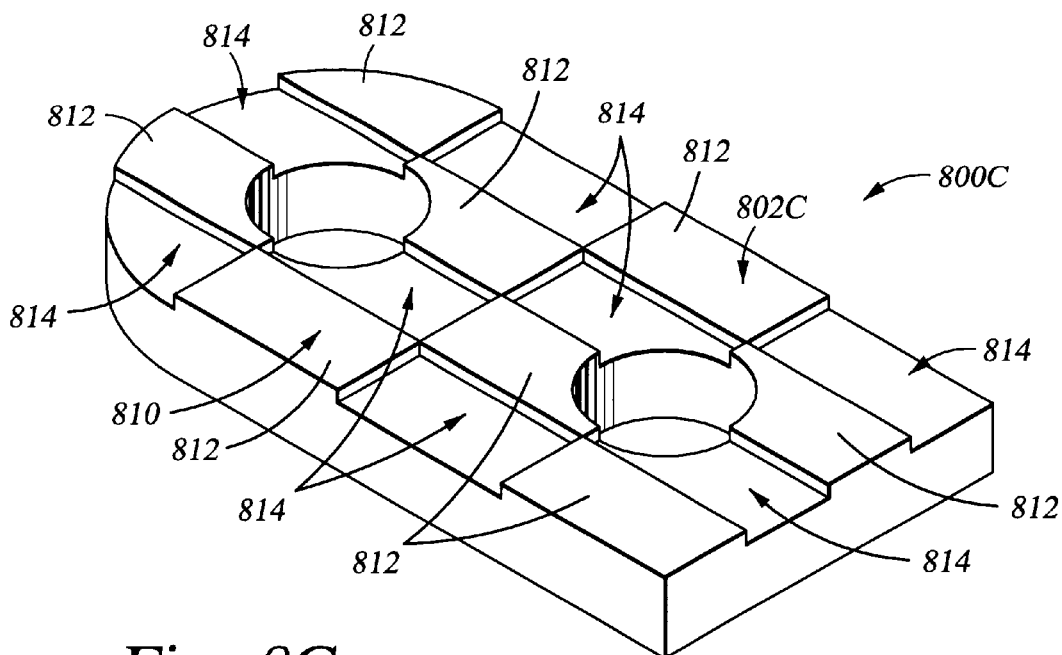

In the embodiment depicted in FIG. 8C, a polymer pad 800C includes a patterned top surface 802C that comprises a grid 810 extending from the top surface 802C. The grid 810 generally comprises a web of projecting support members 812 that may have any geometric configuration and may be disposed on the top surface 802C in a symmetrical, regular (i.e., equally spaced) or random pattern. The support member 812 generally project to a common plane that supports a substrate seated thereon and defines a recessed area 814 therebetween. As the substrate is seated on the support members 812 of the grid 810, the contact area of the pad 800C is reduced.

Figure 8D:
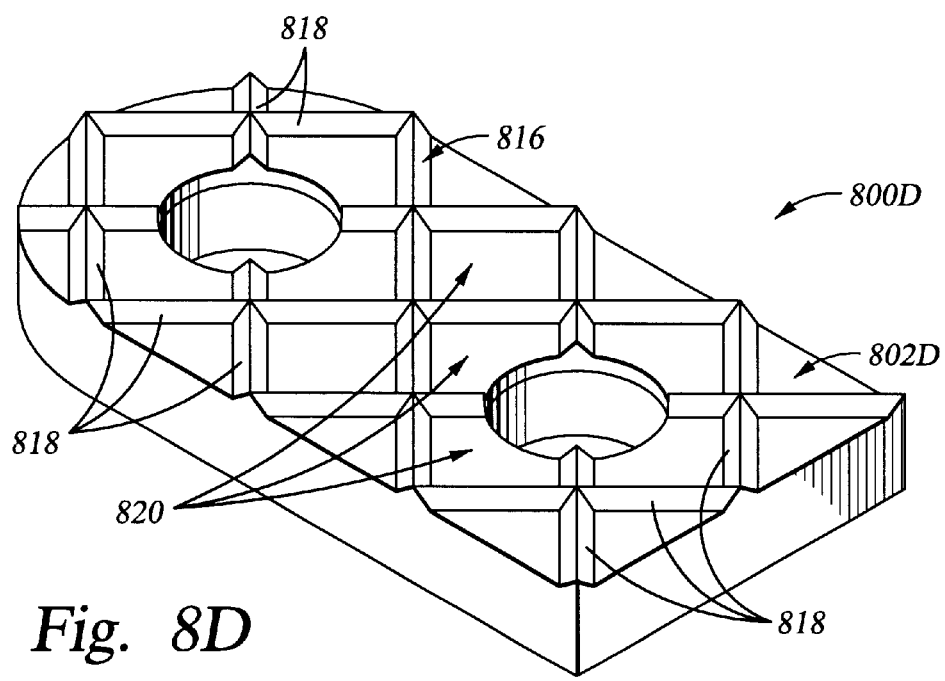

In the embodiment depicted in FIG. 8D, a polymer pad 800D includes a patterned top surface 802D that comprises a mesh 816 extending from the top surface 802D. The mesh 816 generally comprises a plurality of intersecting ridges 818 that project from the top surface 802D. The ridges 818 may intersect and any angle and may be linear, curved or complex in form. The ridges 818 may be disposed on the top surface 802C in a symmetrical, regular (i.e., equally spaced) or random pattern. The ridges 818 generally project to a common plane that supports a substrate seated thereon and defines a recessed area 820 therebetween. As the substrate is seated on the ridges 818 of the mesh 816, the contact area of the pad 800D is reduced.

Figure 8E:
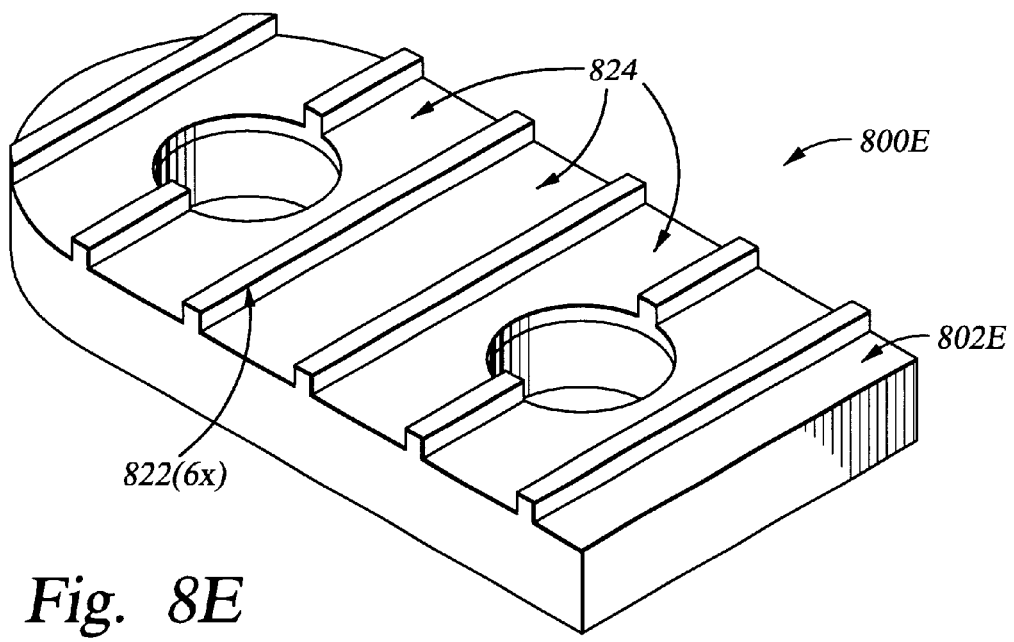

In the embodiment depicted in FIG. 8E, a polymer pad 800E includes a patterned top surface 802E that comprises a plurality of ridges 822 extending from the top surface 802E. The ridges 822 generally project from the top surface 802E and may be linear, curved or complex in form. The ridges 822 may be disposed on the top surface 802E in a symmetrical, regular (i.e., equally spaced) or random pattern. The ridges 822 generally project to a common plane that supports a substrate seated thereon and defines a recessed area 824 therebetween. As the substrate is seated on the ridges 822, the contact area of the pad 800E is reduced.

Figure 8F:
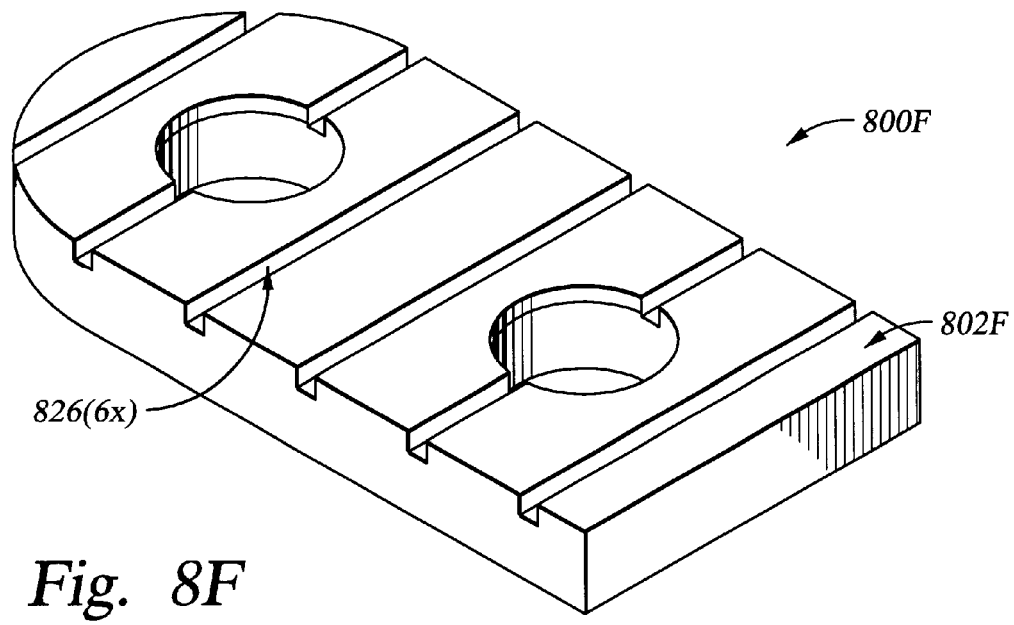

In the embodiment depicted in FIG. 8F, a polymer pad 800F includes a patterned top surface 802F that comprises a plurality of grooves 826 form in the top surface 802F. The grooves 826 generally project into the top surface 802F and may interest, be linear, curved or complex in form. The grooves 826 may be disposed on the top surface 802F in a symmetrical, regular (i.e., equally spaced) or random pattern. The grooves 826 reduce the surface area of the top surface 802F that supports a substrate seated thereon, thereby reducing the contact area of the pad 800F.

Figure 9:
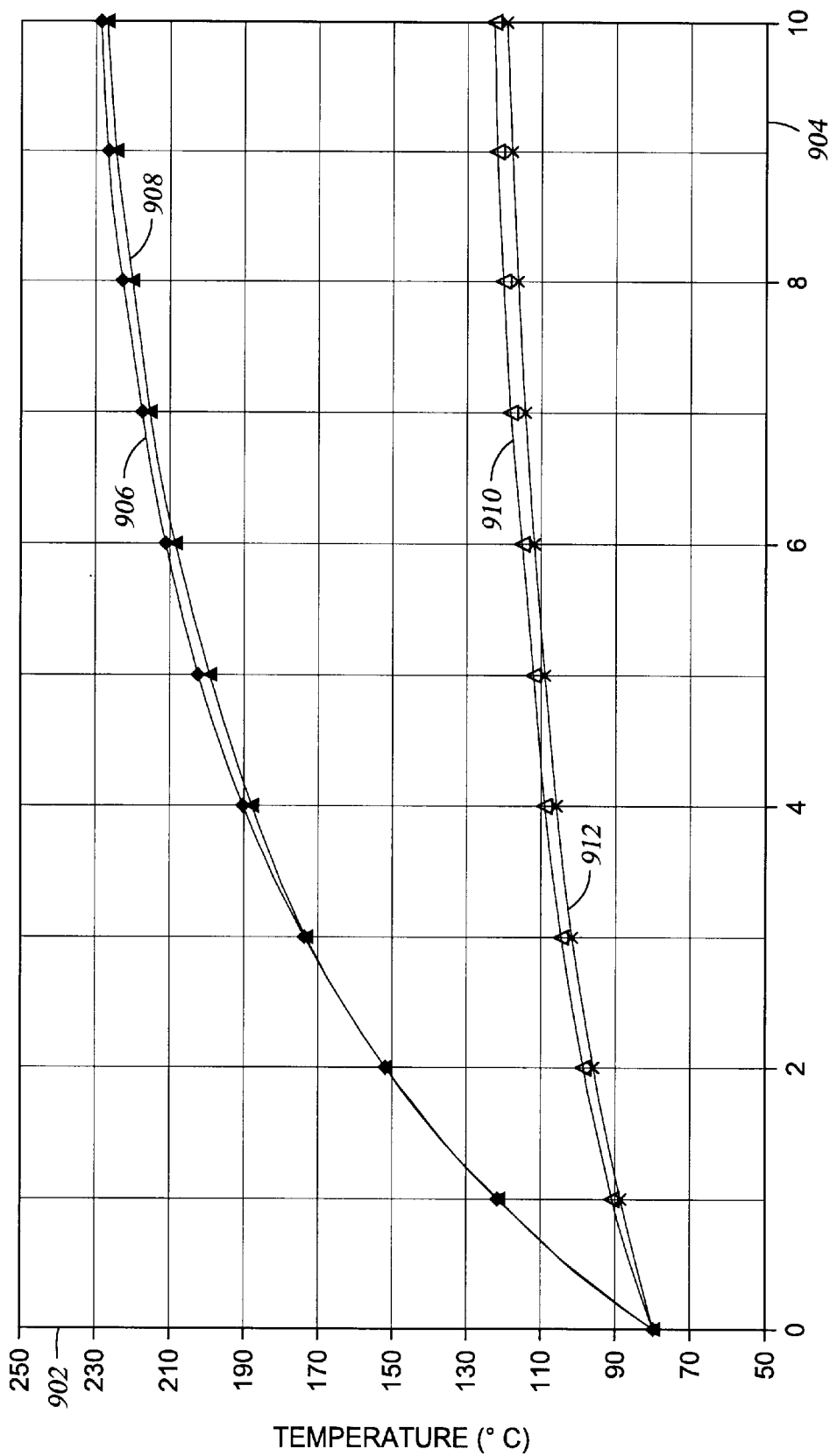
FIG. 9 is a graph depicting temperature rise per exposure time for various embodiments of a polymer pad.

FIG. 9 depicts a graph illustrating the advantages of the patterned surface of the polymer pad described above. A vertical axis 902 represents polymer pad temperature in degrees Celsius. A horizontal axis 904 represents exposure time in seconds. Lines 906–912 depict test results utilizing various substrate supports configured as listed in the chart below.

| Line Number | Polymer Pad Material | Pattern | Pad Color |
| --- | --- | --- | --- |
| 906 | CHEMREZ ® | FLAT | BLACK |
| 908 | KALREZ ® | FLAT | WHITE |
| 910 | CHEMREZ ® | PROJECTIONS | BLACK |
| 912 | KALREZ ® | PROJECTIONS | WHITE |

As illustrated in FIG. 9, the inventive patterned polymer pads substantially reduces pad temperature rise during exposure to hot substrates. Accordingly, the tendency of the polymer pad to stick to the substrate after repeated cycling is reduced along with extending the service life of the polymer pad.

While the foregoing is directed to embodiments of the present invention, other future embodiments of this invention may be revised without departing from the basic scope thereof, and the scope thereof is determined by the claims that follow.

What is claimed is:

1. An end effector assembly for a substrate transfer robot, comprising:
   an end effector;
   a plurality of metallic pads having an upper surface and a lower surface, the lower surface disposed on a first side of the end effector; and
   a polymer pad disposed on each metallic pad, the polymer pad having a top surface and a bottom surface, wherein a ratio of an exposed portion of the upper surface of the metallic pad to the top surface of the polymer pad is at least about 3.5 to 1.

2. The end effector assembly of claim 1, wherein at least one of the polymer pads is white.

3. The end effector assembly of claim 1, wherein at least one of the polymer pads is coated with a fluoropolymer on a upper surface of polymer pad.

4. The end effector assembly of claim 1, wherein at least one of the polymer pads is coated with a fluoropolymer on at least the top surface of the polymer pad.

5. The end effector assembly of claim 1, wherein at least one of the polymer pads is fastened to the metallic pad.

6. The end effector assembly of claim 1, wherein at least one of the polymer pads is staked, screwed, bolted, riveted, adhered, vulcanized or molded to the metallic pad.

7. The end effector assembly of claim 1, wherein at least one of the polymer pads has an emissivity of less than about 7.

8. The end effector assembly of claim 1, wherein at least one of the metallic pads is mirror polished to at least 4 rms or smoother.

9. The end effector assembly of claim 1, wherein at least one of the metallic pads is electro-polished.

10. The end effector assembly of claim 1, wherein at least one of the metallic pads is comprised of aluminum.

11. The end effector assembly of claim 1, wherein at least one of the metallic pads further comprises a lip extending from the upper surface to a level above the top surface of the polymer pad.

12. The end effector of claim 1, wherein the end effector is comprised of a ceramic or quartz material.

13. The end effector assembly of claim 1, wherein the end effector comprises a metallic layer disposed on a first side.

14. The end effector assembly of claim 13, wherein the metallic layer is aluminum.

15. The end effector assembly of claim 13, wherein the metallic layer is electro-polished or mirror polished.

16. The end effector assembly of claim 1, wherein the end effector further comprises:
   a base portion;
   a first member extending from the base portion to a first end; and
   a second member extending from the base portion in a spaced-apart relation to the first member to a second end, the first member and the second member having at least two substrate supports disposed thereon, each substrate supports comprising one metallic pad and one polymer pad.

17. The end effector assembly of claim 1, wherein the top surface of at least one of the polymer pads is patterned.

18. The end effector of claim 17, wherein the pattern comprises a plurality of dimples or protrusions, a grid, a mesh, grooves or ribs.

19. The end effector assembly of claim 1, wherein the plurality of metallic pads comprises at least two metallic pads adapted to bound parallel edges of a substrate.

20. The end effector assembly of claim 19, wherein each of the at least two metallic pads further comprises a lip that projects upwards from the upper surface.

21. An end effector assembly for a substrate transfer robot, comprising:
   an end effector; and
   a plurality of polymer pads disposed on the end effector, the polymer pad having a top surface adapted to support a substrate and a bottom surface; and
   a fluoropolymer coating disposed on at least the top surface of the polymer pad.

22. The end effector assembly of claim 21, further comprising;
   a metallic pad disposed between each, polymer pad and the end effector, the metallic pad having an upper surface and a lower surface, the lower surface disposed on a first side of the end effector, wherein a ratio of an exposed portion of the upper surface of the metallic pad to the top surface of the polymer pad is at least about 3.5 to 1.

23. The end effector assembly of claim 22, wherein at least one of the metallic pads is mirror polished to at least 4 rms or smoother.

24. The end effector assembly of claim 22, wherein at least one of the metallic pads is electro-polished.

25. The end effector assembly of claim 22, wherein at least one of the metallic pads further comprises a lip extending from the upper surface to a level above the top surface of the polymer pad.

26. The end effector assembly of claim 22, wherein at least two metallic pads are adapted to bound parallel edges of a substrate.

27. The end effector assembly of claim 21, wherein the end effector further comprises:
   a base portion;
   a first member extending from the base portion to a first end; and
   a second member extending from the base portion in a spaced-apart relation to the first member to a second end, the first member and the second member having at least two substrate supports disposed thereon, each substrate supports comprising one metallic pad and one polymer pad.

28. The end effector assembly of claim 21, wherein at least one of the polymer pads is white.

29. The end effector assembly of claim 21, wherein at least one of the polymer pads is staked, screwed, bolted, riveted, adhered, vulcanized or molded to the end effector.

30. The end effector assembly of claim 21, wherein at least one of the polymer pads has an emissivity of less than about 7.

31. The end effector of claim 21, wherein the end effector is comprised of a ceramic or quartz material.

32. The end effector assembly of claim 31, wherein the end effector comprises a metallic layer disposed on a first side.

33. The end effector assembly of claim 32, wherein the metallic layer is aluminum.

34. The end effector assembly of claim 32, wherein the metallic layer is electro-polished or mirror polished.

35. The end effector assembly of claim 21, wherein the top surface of at least one of the polymer pads is patterned.

36. The end effector of claim 35, wherein the pattern comprises a plurality of dimples or protrusions, a grid, a mesh, grooves or ribs.

37. An end effector assembly for a substrate transfer robot, comprising:

an end effector;

a plurality of metallic pads having an upper surface and a lower surface, the lower surface disposed on a first side of the end, effector;

a polymer pad disposed on each metallic pad, the polymer pad having a top surface and a bottom surface, wherein a ratio of an exposed portion of the upper surface of the metallic pad to the top surface of the polymer pad is at least about 3.5:1; and a fluoropolymer coating disposed on at least the top surface of the polymer pad.

38. The end effector assembly of claim 37, wherein the end effector further comprises:

a base portion;

a first member extending from the base portion to a first end; and a second member extending from the base portion in a spaced-apart relation to the first member to a second end, the first member and the second member having at least two substrate supports disposed thereon, each substrate supports comprising one metallic pad and one polymer pad.

39. The end effector assembly of claim 32, wherein at least one of the polymer pads is white.

40. The end effector assembly of claim 37, wherein at least one of the polymer pads is staked, screwed, bolted, riveted, adhered, vulcanized or molded to the metallic pad.

41. The end effector assembly of claim 37, wherein at least one of the polymer pads has an emissivity of less than about 7.

42. The end effector assembly of claim 37, wherein at least one of the metallic pads is mirror polished to at least 4 rms or smoother.

43. The end effector assembly of claim 37, wherein at least one of the metallic pads is electro-polished.

44. The end effector assembly of claim 37, wherein at least one of the metallic pads further comprises a lip extending from the upper surface to a level above the top surface of the polymer pad.

45. The end effector of claim 37, wherein the end effector is comprised of a ceramic or quartz material.

46. The end effector assembly of claim 45, wherein the end effector comprises a metallic layer disposed on a first side.

47. The end effector assembly of claim 46, wherein the metallic layer is aluminum.

48. The end effector assembly of claim 46, wherein the metallic layer is electro-polished or mirror polished.

49. The end effector assembly of claim 37, wherein the top surface of at least one of the polymer pads is patterned.

50. The end effector of claim 49, wherein the pattern comprises a plurality of dimples or protrusions, a grid, a mesh, grooves or ribs.

* * * * *

UNITED STATES PATENT AND TRADEMARK OFFICE
CERTIFICATE OF CORRECTION

PATENT NO. : 6,634,686 B2 Page 1 of 1
APPLICATION NO. : 09/970546
DATED : October 21, 2003
INVENTOR(S) : Hosokawa It is certified that error appears in the above-identified patent and that said Letters Patent is hereby corrected as shown below:

In the Claims:

Column 10, Claim 22, Line 13, please delete ";" and insert --:-- therefor;

Column 11, Claim 37, Line 4, please delete ",";

Column 11, Claim 39, Line 24, please delete "32" and insert --37-- therefor.

Signed and Sealed this

Thirty-first Day of March, 2009

JOHN DOLL
*Acting Director of the United States Patent and Trademark Office*